United States Patent [19]

Rau, III et al.

[11] 4,145,702
[45] Mar. 20, 1979

[54] ELECTRICALLY PROGRAMMABLE READ-ONLY-MEMORY DEVICE

[75] Inventors: John W. Rau, III, Escondido; Harold H. Muller, Carlsbad; Richard K. W. Tam, Poway, all of Calif.; Louis J. Kabell, Reno, Nev.

[73] Assignee: Burroughs Corporation, Detroit, Mich.

[21] Appl. No.: 813,001

[22] Filed: Jul. 5, 1977

[51] Int. Cl.$^2$ .................. H01L 67/10; H01L 23/56
[52] U.S. Cl. ......................... 357/45; 357/28; 357/35; 357/86
[58] Field of Search ............. 357/45, 86, 28, 35

[56] References Cited

U.S. PATENT DOCUMENTS

| 3,641,516 | 2/1972 | Castrucci et al. | 340/173 SP |
|---|---|---|---|
| 3,733,690 | 5/1973 | Rizzi | 29/577 |
| 3,742,592 | 7/1973 | Rizzi | 29/574 |
| 3,783,048 | 1/1974 | Sanders | 148/187 |
| 3,848,238 | 11/1974 | Rizzi | 340/173 SP |
| 3,971,058 | 7/1976 | Fagan | 357/36 |

Primary Examiner—Martin H. Edlow
Attorney, Agent, or Firm—Joseph R. Dwyer; Mervyn L. Young; Kevin R. Peterson

[57] ABSTRACT

A matrix of columns and rows of conductors with transistors located at the intersection thereof on a semiconductor chip is formed utilizing the washed emitter process which locates the ohmic contact windows close to the PN junction so that a small size piece of free metal, i.e., not connected to any other conductor, may be located within a short distance, i.e., one micron or less, to the PN junction selected to be fused during the programming of a Read Only Memory. The small size of the free metal as near as possible to this PN junction minimizes heat losses, reduces power consumption and reduces programming errors normally incurred in the programming of Read Only Memories.

5 Claims, 3 Drawing Figures

ELECTRICALLY PROGRAMMABLE READ-ONLY-MEMORY DEVICE

BACKGROUND OF THE INVENTION (1) Field of the Invention

This invention relates, in general, to the construction of programmable read only memories (PROMs) by integrated circuit techniques utilizing short circuiting of PN junctions.

(2) Description of the Prior Art

Matrix arrays in which information is permanently located are known in the art. The matrix array comprises rows and columns of parallel electrical conductors having back-to-back diodes or a transistor connecting the intersections, or cross over points, of the rows and columns and the entire matrix is formed as a single integrated circuit. After the manufacture of the circuit, at predetermined intersections of the rows and columns, the connector devices are permanently altered through the application of a voltage across one of the junctions of the diodes or the transistors thus forming a Read-Only-Memory (ROM). Examples of such permanently altered matrix arrays utilizing transistors and back-to-back PN junctions or diodes at the intersection of the rows and columns of conductors are shown in the U.S. Pats. to Rizzi et al U.S. Pat. Nos. 3,742,592, 3,848,238 and 3,733,690. These patents also teach methods for applying suitable current to selected conductors to program the Read-Only-Memory to form a PROM by fusing or shorting the desired PN junctions at the selected conductor cross-over points. These back-to-back PN junctions also require excessive energy to fuse the junctions which is time consuming. The problem involved in this prior art was (and still is) to make certain that the desired PN junction of the selected pair of junctions in the transistor or pair of diodes is the one that is shorted so that a programming error is not introduced into the PROM. Because of this problem, considerable time and carefully monitored voltages were utilized to prevent such an error. For example, the foregoing Rizzi U.S. Pat. No. 3,742,592 teaches the need for careful regulation of an applied pulse current of a predetermined amplitude and duration across the junctions by carefully limiting not only the pulse height but also the pulse width taking into consideration and parameters involved in the structure of the junction.

Another patent in this field is the U.S. Pat. to Castrucci et al U.S. Pat. No. 3,641,516 which also shows back-to-back diodes, or "cells" as they are referred to in the patent, in an integrated circuit matrix wherein selected diodes of the cells are fused, or permanently altered, by directing a fusing current to the selected diodes in the cells. This patent was directed towards avoiding a so-called "sneak path" problem by making the diodes in a cell such that the diodes to be fused have a lower breakdown voltage than those which are not to be fused. This was accomplished by providing an N+ region formed in the epitaxial layer between two P regions and touching one of the P regions. The patent also discloses the use of free metal which is not connected to other conductor elements of the chip to provide a terminal for an aluminum-silicon alloy connection across the fused junction formed by the fusing process. This patent further describes in some detail the amount of power and the length of time that is required to fuse the junctions. For example, it stated that the device having the free metal and the N+ region " . . . was found to fuse (in this case to go from 8 volts to less than 1 volt) in about 1 to 10 milliseconds under an applied current of 100 milliampers . . . " Column 4 lines 60–63. When fusion took place, an aluminum-silicon alloy connector formed beneath the oxide coating and connected the conductor of the row or column to the free metal thus shorting the PN+ junction.

Thus, all of the prior art recognize the need for ensuring that the selected junction of a pair of back-to-back diodes, or of a transistors, is fused to make the desired connection between the selected row and column conductors of the matrix and also the problem of excess energy consumption.

When the energy required to fuse the selected junction is great, the programming of a matrix is slow because the entire chip would be destroyed by heat unless the matrix is programmed slowly cell by cell. Today, the programming of the matrix is done on a machine which applies the correct pattern of pulses and could apply such pulses in a few microseconds except that the speed of the programming process is too fast so much heat is generated that there is a danger of destroying the entire chip. Thus, a relatively expensive machine capable of high speed operation is operated at a relatively low speed.

Another factor in the matter of excess energy to program the devices is that other transistors on the chip must be extra large to supply or control this energy without destruction. This extra size limits the number of devices that can be placed on the chip. This size requirement necessitates a larger circuit path which causes the circuitry to operate slower not at the time of programming the matrix but when the information stored in the memory is read out.

Turning now again to the foregoing prior art, it is apparent that it did not address the correct solution of the error reduction problem and excess energy consumption.

More specifically, the prior art did not recognize that a reduction in energy is related inversely to the distance from the PN junction to that free metal and thus the location of the free metal on the chip as well as the size of the free metal is important for the reduction of power and time more so than simply providing a terminal for an aluminum-silicon alloy connection and also presumably as a supplier of aluminum atoms for formation of the aluminum-silicon alloy as set forth in the Castrucci et al patent, supra. The reason that size is important is that it has been discovered that this properly located piece of free metal, if kept as small as possible, will avoid excess absorption of heat and serves to localize the heat, otherwise conducted away, involved in the fusion process and thus reduces the power consumption.

Accordingly, from the foregoing, it can be seen that one of the objects to this invention is to reduce energy in programming a PROM and at the same time reduce programming errors which have occurred in the prior art PROMs.

SUMMARY OF THE INVENTION

The invention which accomplishes the above desired goals utilizes the washed emitter process to form the transistors or back-to-back diodes at the intersections of the rows and columns of conductors in a semiconductor chip so that the free metal can be located as close as possible to the PN junction, i.e., the emitter-base junction or the back biased diode. The wash process is old and a typical example is shown in the U.S. Pat. No. 3,783,048 to Sanders and was originally developed for the purpose of obtaining a high speed shallow junction semiconductor device but it has been discovered that this process is adaptable and most useful in the formation of this invention. Utilizing this process, the edge of the contact window is very close to the PN junction; the actual spacing, in practice, is more or less equal to the extent of the lateral diffusion of the N region which lateral diffusion may be less than 1 micron. With the contact window this close to the PN junction, the free metal can be placed very close to this junction and in order to minimize heat losses, this piece of metal is kept small in size and is not connected to any other circuit components. In the preferred embodiment of this invention the buried collector layer of the conventional transistor such as illustrated in the Rizzi et al patents is omitted although it is within the scope of the invention to form a transistor with such a buried layer if thought necessary for a particular application of this invention.

DESCRIPTION OF THE PREFERRED EMBODIMENT

Figure 1:
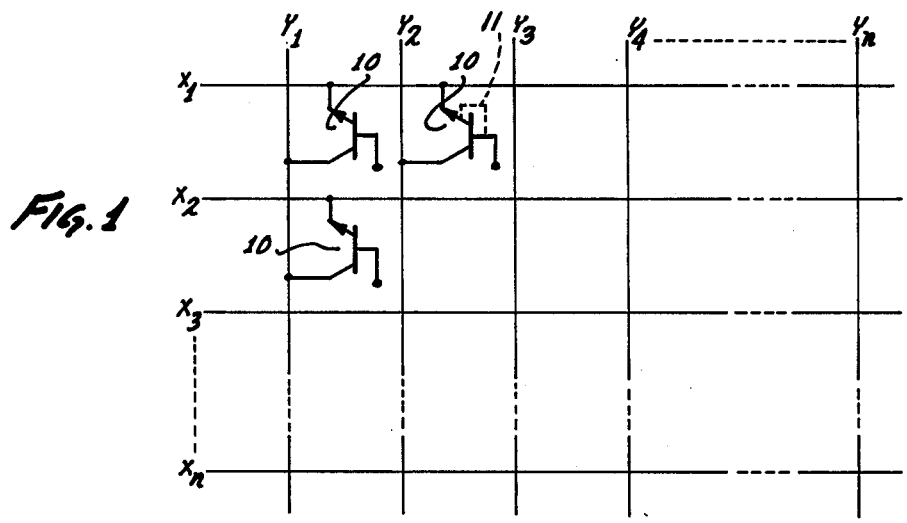
FIG. 1 is an illustration of a matrix with transistors or back-to-back diodes located at the cross-over points or intersections of the rows and columns of conductors.

In FIG. 1 there is shown a schematic illustration of a transistor or diode integrated circuit matrix formed of a plurality of substantially parallel electrically conducting rows $X_1-X_n$ and a second plurality of spaced apart parallel electrically conducting columns $Y_1-Y_n$ which are disposed normal to the rows but out of contact therewith. The rows and columns are disposed in separate levels with transistor or back-to-back diode 10 located at the intersection or cross-over points of columns and rows. Conventionally, information is stored in the matrix in a binary state, typically a fused or shorted junction of the transistor or back-to-back diode 10 represents one of the two binary states which represent information such as a computer program to be stored in memory; one such shorted junction shown by the dotted connection 11 between the emitter and base of the transistor or one junction of a back-to-back diode 10 located at the crossover point between conductors $X_1$ and $Y_2$. The fused junction between one row and one column is information permanently stored in the matrix and thus, the matrix is commonly termed a read-only memory or ROM as stated above.

Figure 2:
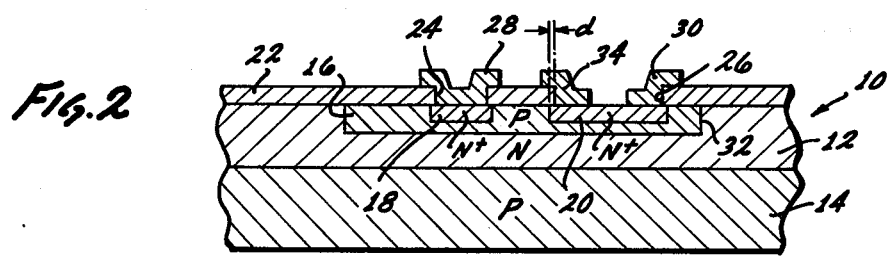
FIG. 2 shows the transistor or back-to-back diodes formed in the accordance with the teachings of this invention in cross-sectional view.
Figure 3:
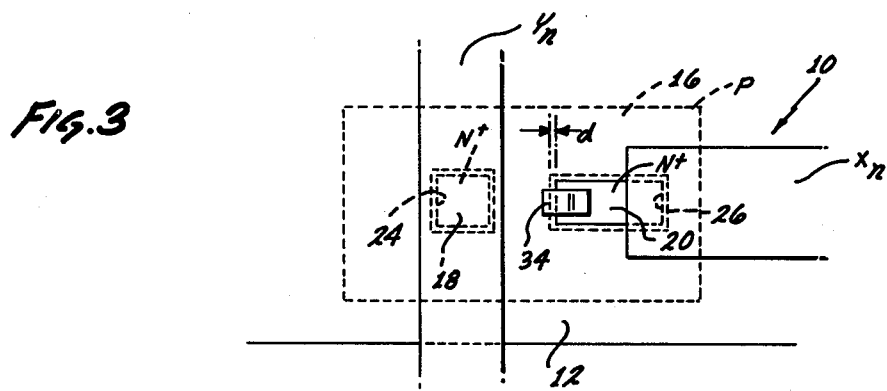
FIG. 3 shows the top view of the PROM element.

Turning now to FIGs. 2 and 3, it can be seen that a single transistor or back-to-back diode of an integrated circuit matrix in accordance with the present invention is illustrated schematically. The illustrated single transistor or back-to-back diode 10, as shown in FIG. 3, includes an N-type epitaxial region 12 on a P-type substrate 14 at the top of which there is formed a P-type base region 16 within which are formed an N+ type collector region 18 and an N+ type emitter region 20. An oxide coating 22 insulates the upper surface and overlays the PN junctions thereat. Openings 24 and 26 are provided through the oxide layer 22 for a contact 28, contact 30, and an optional base contact (not shown).

The transistor or back-to-back diode illustrated is similar to a normal high frequency NPN transistor formed utilizing the washed emitter process, such as disclosed in the patent to Sanders U.S. Pat. No. 3,783,048, supra. This process comprises generally the functions of forming the base region 16 by diffusing P-type impurities through a window (not shown but essentially of a size generally defined by the periphery 32 of the base layer 16) in the oxide layer 22 and during this high temperature diffusion process of a thinner layer of oxide (not shown) over the surface exposed by the window and thereafter the formation of phosphorous doped silicon dioxide over the entire exposed surface by thermal growth in an atmosphere containing phosphorus atoms or by the deposition of SiO2 together with the phosphorus atoms.

The collector window 24 and the emitter diffusion window 26 are opened by selectively etching such as by photoresist and standard photolithographic techniques but the oxide layer 22 is left substantially intact.

During the N+ emitter and collector diffusion step with phosphorus typically used as a donor impurity, the N+ type collector region 18 and emitter region 20 are formed beneath the windows 24 and 26. Since diffusion occurs in every direction within the base region 16, the collector and emitter regions ultimately extend beyond the sides of the windows beneath the oxide layer 22. As a consequence of the high temperature phosphorus diffusion process, a phosphorus doped silicon dioxide layer (not shown) is grown over windows 24 and 26 and over the remaining exposed surface including the previously applied oxide layers.

By virtue of the high phosphorus concentration and the thinness of the aforementioned oxide layer over windows 24 and 26, a brief HF etch is sufficient to reopen the windows to permit the application of the collector and emitter contacts 26 and 28, while leaving the oxide layer over other areas substantially unetched. Moreover, this washed emitter window is smaller than the surface of emitter region because of the aforementioned lateral diffusion and is therefore an ideal size through which to deposit the emitter and collector contacts 28 and 30 therethrough together with a relatively small piece of metal 34. This metal 34 is introduced into the same window 26 as the emitter contact material to overlie the PN junction between the base and the N+ emitter. This piece of metal 34 is completely out of physical contact with the other metals.

The foregoing description of the washed emitter process is conventional but given here in connection with the invention because it is important to the operation of this invention. The advantages of the washed emitter process in resolving mask alignment problems in the conventional diffusion process are known but it is important herein that the window used to locate the isolated metal 34 is located in close proximity to the PN junction. In a typical process, not using the washed emitter process, the distance between the edge of the window and the PN junction and therefore the edge of the metal and the junction is normally about 3-4 microns which is the absolute minimum because of the tolerance required for an alignment of a mask. When the washed emitter process is used, however, the distance between the edge of the window, therefore the metal, and the junction, is slightly less than the depth of the diffusion which in practice is about 6/10ths of a micron deep. This means that there is only about 4/10ths of a micron or so from the metal to the edge instead of the 4-6 microns. This is identified in FIG. 2 by distance "d". It can be appreciated that this is a 10 to 1 gain in distance with an approximately commensurate 10:1 reduction in time and energy required to fuse the junction.

Finally, not only is the distance "d" shortened by a 10:1 ratio over the distance available when a conventional process is used but the size of the metal 34 is kept to a minimum so that this small piece of metal 34 reduces the dissipation of heat by conduction. Therefore, the temperature can rise higher for the same amount of applied power.

The size of the piece of metal can be made as small as possible; the size being limited only by photolithographic requirements with allowance for alignment of the masks used in the process of manufacture. Presently, a piece of metal 3 microns by 3 microns is feasible and examples of materials suitable for the purpose and aluminum and gold.

Thus, with the distance between the metal 34 and the junction to be fused reduced, and with the size of the metal kept as small as possible, fusion takes place with an applied current of about 50 milliamperes at about 8 volts in about 1 to 10 microseconds or about 1/20 the energy required to fuse the junctions in the aforesaid prior art matrices with the result that current energy capabilities of interconnections can be reduced thus allowing a more compact structure.

Finally, from the foregoing it can be seen that the machine utilized to program the matrix according to a selected code can operate faster and with more accuracy than before.

The term "fuse" or "fused" as used herein is to be interpreted in the broadest sense to describe the alteration of the PN junction so that the junctions can conduct current in both directions at a low voltage. Also the terms "emitter" and "collector" are used to describe or identify conventional structure but are not intended to imply that such structure must be used in the conventional way in all modes of operation.

What is claimed is:

1. A permanently alterable semiconductor device comprising a body of semiconductor material having a PN junction therein,
   a first conductor forming a first terminal electrically contacting said body on one side of said junction,
   a second conductor forming a second terminal electrically contacting said body on the other side of said junction,
   free metal electrically contacting said body and positioned between said first and second terminals but out of contact with the latter,
   an insulating layer on said body,
   two semiconductor regions of a first conductivity type beneath said insulating layer and physically separated from each other by a semiconductor region of a second conductivity type, said first and second terminals, respectively, contacting said two semiconductor regions of a first conductivity type, said free metal contacting one of said two regions of said first conductivity type,
   said first conductivity type region being formed by a washed emitter process which forms a window in said insulating layer which has an edge near said PN junction so that the free metal overlying said edge minimizes the distance between the free metal where it contacts said semiconductor region of first conductivity type and said PN junction for localizing heat for fusing said PN junction when said semiconductor device is permanently altered by the appliction of selected current.

2. The semiconductor as claimed in claim 1 wherein the distance between said free metal and said PN junction is less than 1 micron.

3. The semiconductor as claimed in claim 2 wherein said free metal is about 3 microns × 3 microns in dimension.

4. The semiconductor as claimed in claim 1 wherein a plurality of said first terminals are connected together to form conductor lines, and wherein a plurality of said second terminals are connected together to form conductor lines, said lines being arranged in columns and rows and wherein a plurality of alterable devices are connected between said lines to form a matrix of permanently and selectively alterable devices.

5. A permanently alterable semiconductor device comprising a body of semiconductor material having a PN junction therein,
   a first conductor forming a first terminal electrically contacting said body on one side of said junction,
   a second conductor forming a second terminal electrically contacting said body on the other side of said junction,
   free metal electrically contacting said body and positioned between said first and second terminals but out of contact with the latter,
   an insulating layer on said body,
   two semiconductor regions of a first conductivity type beneath said insulating layer and physically separated from each other by a semiconductor region of a second conductivity type, said first and second terminals, respectively, contacting said two semiconductor regions of a first conductivity type, said free metal contacting one of said two regions of said first conductivity type,
   said first conductivity type region being formed beneath a window in said insulating layer such that an edge of said window is spaced from said PN junction an amount approximately the extent of diffusion of said first conductivity material in said second conductivity material and said free metal overlying said edge of said window so as to minimize the distance between the free metal where its contacts said semiconductor region of said first conductivity type and PN junction for localizing heat for fusing said junction when said semiconductor device is permanently altered by the application of selected current.

* * * * *